United States Patent
Schmidt

(10) Patent No.: US 9,190,382 B2
(45) Date of Patent: Nov. 17, 2015

(54) METHOD FOR PRODUCING A SEMICONDUCTOR MODULE BY USING AN ADHESION CARRIER

(71) Applicant: Infineon Technologies AG, Neubiberg (DE)

(72) Inventor: Michael Schmidt, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/295,373

(22) Filed: Jun. 4, 2014

(65) Prior Publication Data
US 2014/0363925 A1 Dec. 11, 2014

(30) Foreign Application Priority Data
Jun. 11, 2013 (DE) .......................... 10 2013 210 850

(51) Int. Cl.
| | |
|---|---|
| H01L 21/00 | (2006.01) |
| H01L 23/00 | (2006.01) |
| H01L 21/56 | (2006.01) |
| H01L 21/683 | (2006.01) |
| H01L 21/66 | (2006.01) |
| H05K 3/00 | (2006.01) |
| H01L 21/48 | (2006.01) |
| H05K 3/34 | (2006.01) |

(52) U.S. Cl.
CPC .............. *H01L 24/33* (2013.01); *H01L 21/568* (2013.01); *H01L 21/6835* (2013.01); *H01L 21/6836* (2013.01); *H01L 22/12* (2013.01); *H01L 24/27* (2013.01); *H01L 24/743* (2013.01); *H01L 24/75* (2013.01); *H01L 24/83* (2013.01); *H01L 24/95* (2013.01); *H05K 3/007* (2013.01); *H05K 3/0097* (2013.01); *H01L 21/4867* (2013.01); *H01L 24/29* (2013.01); *H01L 24/32* (2013.01); *H01L 2221/68322* (2013.01); *H01L 2221/68381* (2013.01); *H01L 2224/2732* (2013.01); *H01L 2224/2919* (2013.01); *H01L 2224/29101* (2013.01); *H01L 2224/29339* (2013.01); *H01L 2224/32225* (2013.01); *H01L 2224/83001* (2013.01); *H01L 2224/8384* (2013.01); *H01L 2224/83192* (2013.01); *H01L 2224/83801* (2013.01); *H01L 2224/83855* (2013.01); *H01L 2924/0781* (2013.01); *H01L 2924/07802* (2013.01); *H05K 3/3431* (2013.01); *H05K 2203/0139* (2013.01); *H05K 2203/0195* (2013.01); *H05K 2203/085* (2013.01)

(58) Field of Classification Search
CPC ................. H01L 2224/97; H01L 2224/85001; H01L 21/84; H01L 2224/024
USPC .................................. 438/118, 119, 125, 107
See application file for complete search history.

(56) References Cited

U.S. PATENT DOCUMENTS

| | | | |
|---|---|---|---|
| 8,722,460 B2 * | 5/2014 | Koyanagi ....................... 438/109 |
| 9,006,081 B2 * | 4/2015 | Ahn et al. ....................... 438/455 |
| 2009/0023243 A1 * | 1/2009 | Koyanagi ....................... 438/107 |
| 2014/0061878 A1 * | 3/2014 | Mahler et al. ................. 257/666 |
| 2014/0252654 A1 * | 9/2014 | Lin et al. ....................... 257/774 |

\* cited by examiner

*Primary Examiner* — S. V. Clark
(74) *Attorney, Agent, or Firm* — Murphy, Bilak & Homiller, PLLC

(57) ABSTRACT

A method for producing a semiconductor module includes providing an adhesion carrier and a plurality of circuit carriers. The adhesion carrier has an adhesive upper side and a lower side opposite the adhesive upper side. Each of the circuit carriers includes a ceramic carrier and an upper conductor layer applied to the ceramic carrier, and a circuit carrier lower side. By placing the circuit carriers onto the adhesive upper side, the circuit carrier lower side of the circuit carriers contacts and adheres to the adhesive upper side, so that a quasi-panel is formed, in which the circuit carriers are processed while preserving the quasi-panel and can then be removed from the adhesive upper side.

11 Claims, 5 Drawing Sheets

METHOD FOR PRODUCING A SEMICONDUCTOR MODULE BY USING AN ADHESION CARRIER

PRIORITY CLAIM

This application claims priority to German Patent Application No. 10 2013 210 850.8, filed on 11 Jun. 2013, the content of said German application incorporated herein by reference in its entirety.

BACKGROUND

In the processing of circuit carriers, such as are used for example in semiconductor modules, positioning inaccuracies, which accumulate in the course of the processing, respectively occur during different process steps. Owing to this, necessary safety distances, for example required in order to avoid sparking, need to be dimensioned on a corresponding scale. As a result, this means that the circuit carriers must be configured with a correspondingly large area because of these positioning inaccuracies, in order to avoid incorrect positioning, short circuits or sparking. Furthermore, these positioning inaccuracies limit the achievable integration density of the components installed on the circuit carrier.

SUMMARY

Embodiments described herein provide a method for producing a semiconductor module with improved positioning accuracy.

In order to produce a semiconductor module, an adhesion carrier is used which has an adhesive upper side and a lower side opposite the adhesive upper side. With the aid of such an adhesion carrier, it is possible to produce a quasi-panel by placing a plurality of circuit carriers onto the adhesive upper side, so that the lower side of the relevant circuit carrier contacts the adhesive upper side and adheres thereon, and therefore also on the adhesion carrier. Each of the circuit carriers in this case has a ceramic carrier, an upper conductor layer applied onto the ceramic carrier, and a circuit carrier lower side.

Because the circuit carriers are processed while preserving the quasi-panel, multiple relocation of the individual circuit carriers is obviated, so that the positioning inaccuracy is consequently reduced.

Another advantage is that a plurality of circuit carriers can be processed in parallel so long as the quasi-panel exists, i.e. so long as the circuit carriers are adhering on the adhesive upper side, without them having to be relocated during the subsequent processing after their first placement onto the adhesive upper side.

So that the circuit carriers, which are generally very thin, can be removed again from the adhesive upper side without damage, the adhesion carrier may be adjusted in such a way that the adhesion strength between the adhesive upper side and the circuit carrier lower side of the circuit carriers placed onto the adhesion carrier is less than or equal to 4.5 N/cm² at the positions where the circuit carrier contacts the adhesive upper side. In order, on the other hand, to avoid slipping of the circuit carriers placed onto the adhesion carrier, the adhesion carrier may be adjusted in such a way that the aforementioned adhesion strength is greater than 0.13 N/cm² at the positions where the circuit carrier contacts the adhesive upper side.

As an alternative or in addition, for each of the circuit carriers, the removal force required in order to remove this circuit carrier from the adhesive surface may be greater than 2 times and/or less than 70 times the weight of this circuit carrier.

Another advantage of such an adhesion carrier is that it can be reused. If need be, for example when the adhesive upper side is contaminated by dust or in another way, the upper side may be cleaned and the adhesion carrier may be used again for processing a plurality of further circuit carriers.

Those skilled in the art will recognize additional features and advantages upon reading the following detailed description and on viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
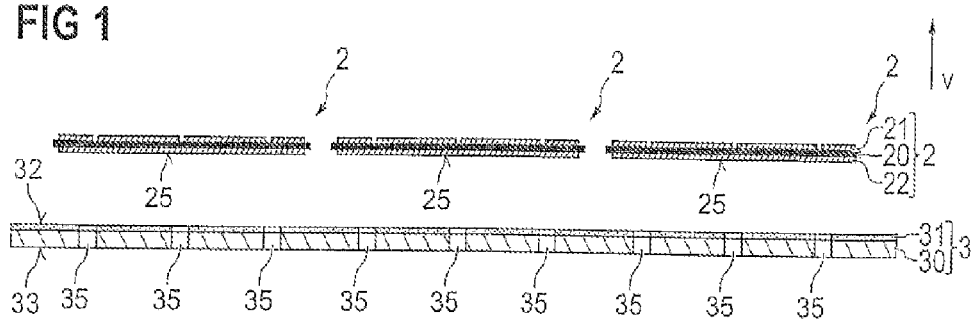
FIG. 1 shows an adhesion carrier which is provided, and a plurality of circuit carriers which are provided.
Figure 2:
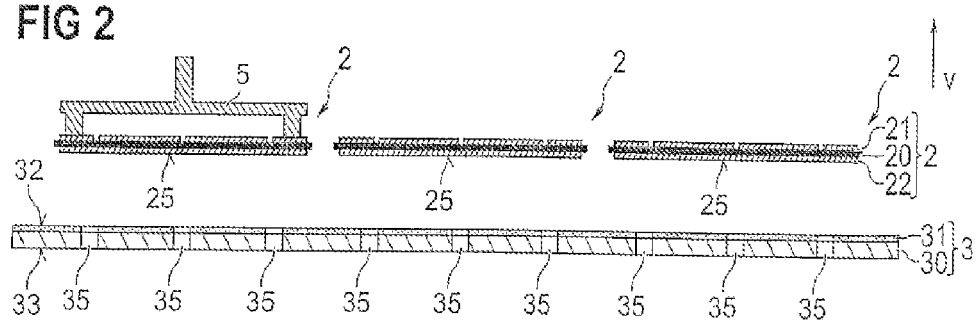
FIGS. 2 to 6 show a plurality of steps during the placement of the circuit carriers onto the adhesion carrier in order to produce a quasi-panel.
Figure 3:
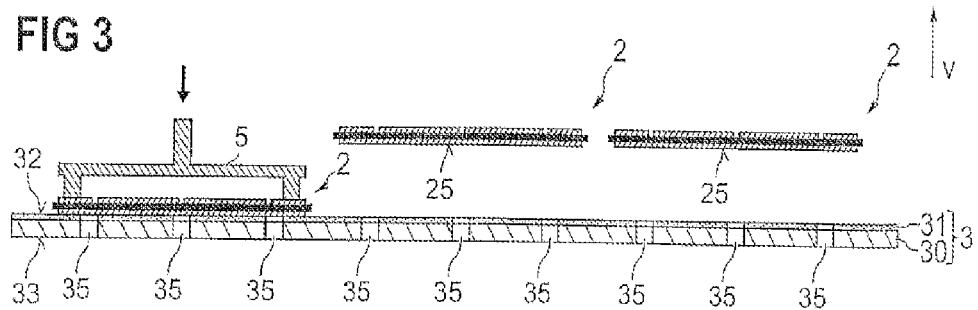
Figure 4:
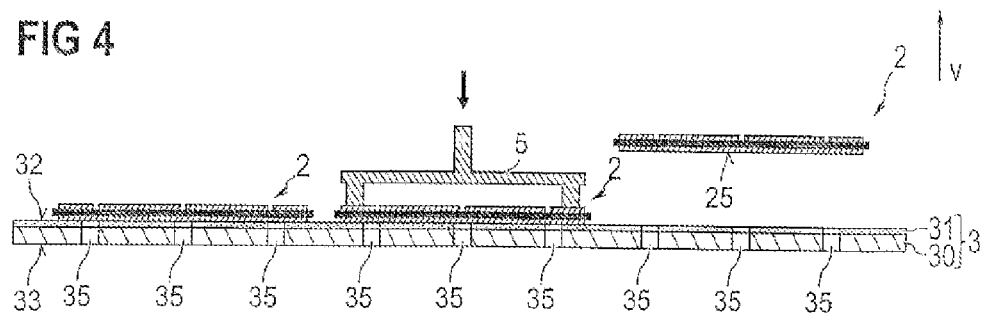
Figure 5:
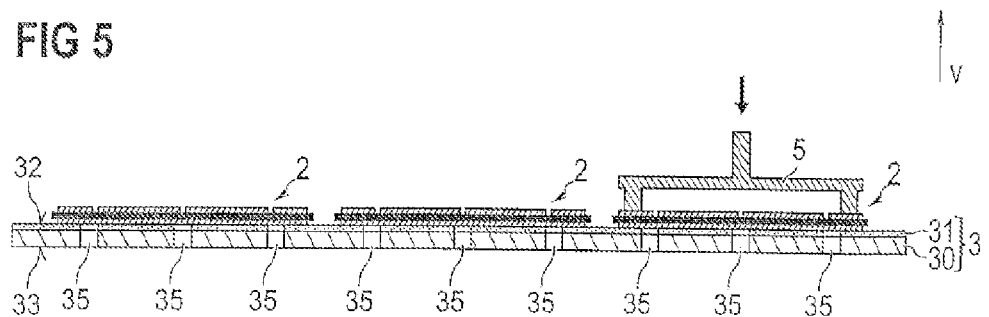

FIG. 1 shows an adhesion carrier 3. The adhesion carrier 3 has an adhesive upper side 32, and a lower side 33. The upper side 32 and the lower side 33 form opposite sides of the adhesion carrier 3. The adhesion carrier 3 furthermore has a number of through-openings 35, each of which extends continuously between the upper side 32 and the lower side 33.

Likewise shown in FIG. 1 are a plurality of circuit carriers 2 which are provided, each of which has a ceramic carrier 20, an upper conductor layer 21 applied onto the ceramic carrier, and an optional lower conductor layer 22. The upper conductor layer 21 may optionally be structured in order to form a conductor structure of conductor tracks and/or conductor surfaces independent of one another. The conductor layers 21 may for example be metallization layers, for example copper or aluminum layers, or conductor layers which are produced in thick-film technology, that is to say from a mixture of metal flakes and an adhesive.

In order to produce the adhesive upper side 32, the adhesion carrier 3 has an adhesion layer 31, which may consist of a polymer and which is applied onto a base carrier 30. The adhesion layer 31 may in this case be applied onto the base carrier 30 over the full surface or in a structured form. The polymer adhesion layer 31 may either contain silicone or be free of silicone.

As represented with the aid of FIGS. 2 to 5, the individual circuit carriers 2 may for example be placed sequentially onto the adhesion carrier 3 with their respective circuit carrier lower side 25, so that the circuit carrier lower side 25 contacts the adhesive upper side 32 and adheres thereon. In order to place the circuit carriers 2 onto the adhesion layer 31, any conventional pick-and-place device 5 may be used. Of course, it is also possible to place two, several or all of the circuit carriers 2 onto the adhesion carrier 3 simultaneously instead of sequentially.

In the example shown, the circuit carrier lower sides 25 are formed by the lower conductor layers 22 of the circuit carriers 2. In principle, however, a circuit carrier lower side 25 may also be formed by any other desired material or by any other desired material combination.

Figure 6:
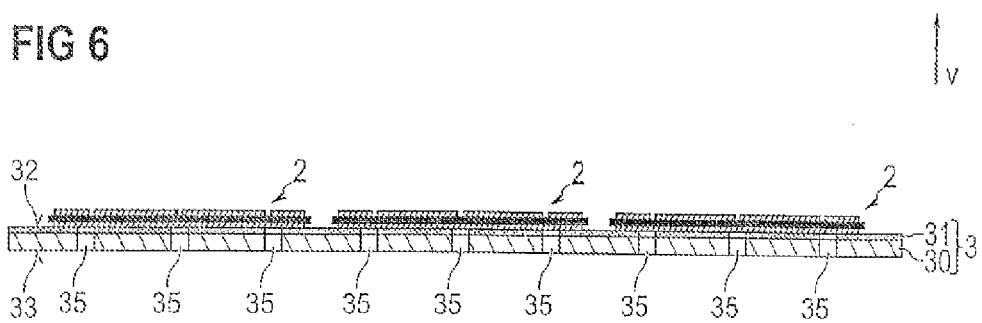

FIG. 6 shows the arrangement after placement of all the circuit carriers 2 onto the adhesion carrier 3. This arrangement therefore forms a quasi-panel, in which the circuit carriers 2 adhering on the adhesive upper side 32 are fixed relative to one another and relative to the outer edges of the adhesion carrier 3, and can be processed further in the form of this quasi-panel.

As an example of the further processing, the fitting of semiconductor chips 1 on the individual circuit carriers 2 will be explained below. In principle, however, any other desired alternative or additional processing steps may be carried out while preserving the quasi-panel. A prerequisite for this is merely that the preservation of the quasi-panel is not put at risk by the respective process conditions. Such a process condition could, for example, be that the adhesion between the circuit carriers 2 and the adhesive upper side 32 is reduced so greatly by the effect of temperature that, for example, the circuit carriers 2 can slip on or fall off the adhesion carrier 3.

So that the circuit carriers 2 can be removed without damage from the adhesive surface 32 after their processing, the adhesion layer 31 may be adjusted in such a way that the adhesion strength between the circuit carrier lower side 25 and the adhesive upper side 32 is less than or equal to 4.5 $N/cm^2$ at the positions where the circuit carrier 2 contacts the adhesive upper side. A simple peel test may be carried out in order to determine the adhesion strength.

In order, on the other hand, to avoid a circuit carrier 2 placed onto the adhesive upper side 32 and adhering thereon from being inadvertently displaced, the adhesion layer may furthermore be adjusted in such a way that the aforementioned adhesion strength is greater than 0.13 $N/cm^2$ at the positions where the circuit carrier 2 contacts the adhesive upper side.

When adjusting the adhesion strength, it should be taken into account that it depends not only on the properties of the adhesion layer 31 but also on the properties of the circuit carrier lower sides 25. The crucial properties are on the one hand the combination of the materials involved, that is to say the material of the adhesion layer 31 and the material which forms the circuit carrier lower side 25, and on the other hand the surface geometry of the adhesive surface 32 and of the circuit carrier lower side 25. For example, the adhesion strength may be reduced by structuring the adhesion layer 31 (for example to form a plurality of sections separated from one another or by recesses in the adhesion layer 31), so that not all of the circuit carrier lower side 25 is in contact with the adhesion layer 31. For example, here as in all other embodiments, the adhesion strength may be adjusted in such a way that the removal force which is required in order to remove the circuit carrier 2 from the adhesive surface 32, is greater than 2 times the weight of the circuit carrier 2 and/or less than 70 times the weight of the circuit carrier 2.

Figure 7:
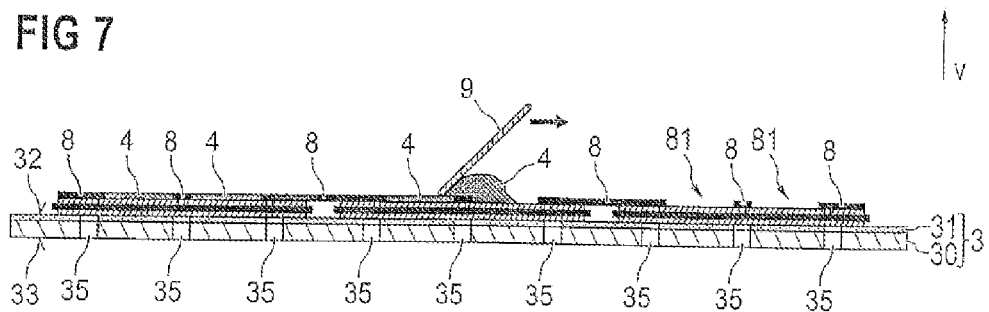
FIG. 7 shows the application of a bonding material with the aid of a template onto the circuit carriers adhering on the adhesion carrier.

As is furthermore shown in FIG. 7, in order to fasten semiconductor chips on the circuit carriers 2, a bonding medium 4 may firstly be applied in a structured manner. The application of the bonding medium 4 may for example be carried out with the aid of a template 8, which is provided with openings 81 into which the bonding medium 4 is introduced with the aid of a blade 9. In this way, the circuit carriers 4 are provided with a layer of the bonding medium 4 in the region of the openings 81.

The bonding medium may for example be a paste containing metal, for example a solder paste or a sinterable paste. A sinterable paste may, for example, contain a mixture of silver powder or silver flakes and a solvent. The bonding medium 4 may also be an electrically conductive or electrically insulating adhesive.

Figure 8:
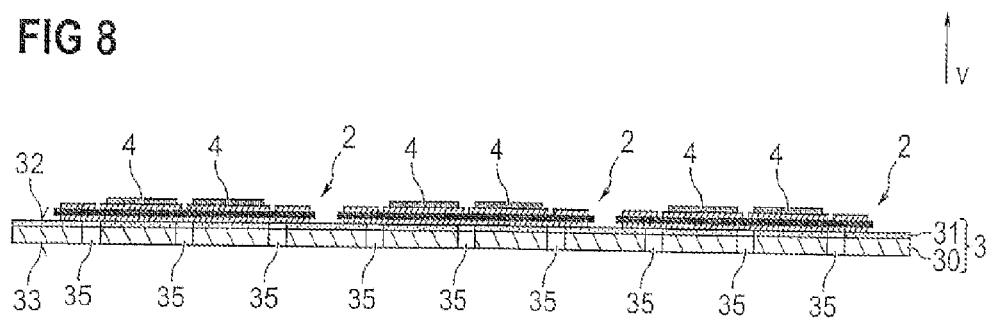
FIG. 8 shows the quasi-panel after removal of the template.

FIG. 8 shows the quasi-panel after removal of the template, and the bonding medium 4 applied in the region of the openings 81 of the template 8.

Figure 9:
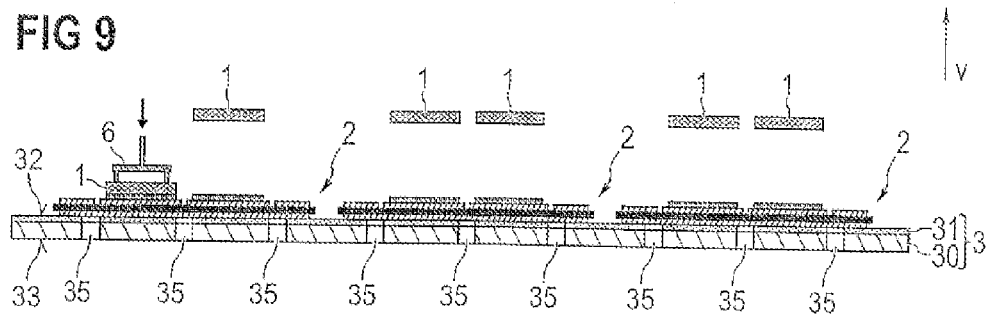
FIGS. 9 and 10 show various steps during the placement of semiconductor chips onto the applied bonding material.
Figure 10:
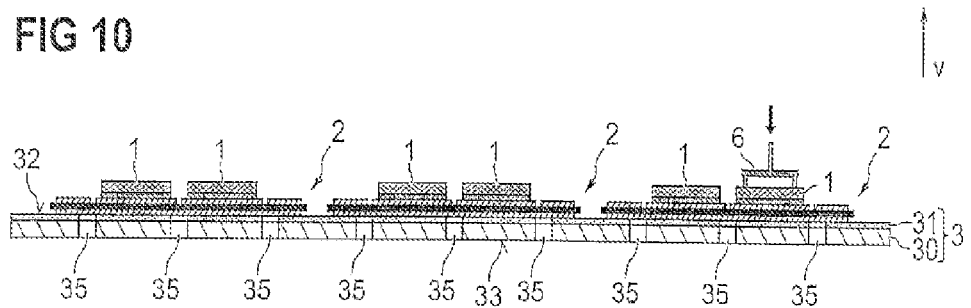

As is furthermore represented in FIGS. 9 and 10, each of the circuit carriers 2 is then fitted with one or more semiconductor chips 1 by the semiconductor chips 1 being placed sequentially onto the previously applied bonding medium 4. As an alternative to this, however, it is also possible to place two, several or all of the semiconductor chips 1 simultaneously onto the circuit carriers 2. The placement of the semiconductor chips 1 is carried out by means of a conventional pick-and-place device 6. This may be the same as or different to the pick-and-place device 5 described above.

Figure 11:
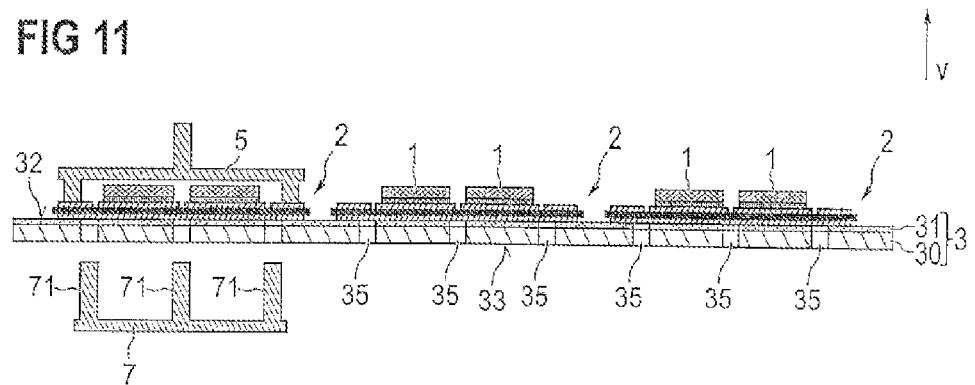
FIGS. 11 and 12 show various steps during the removal of the processed circuit carriers from the adhesion carrier.
Figure 12:
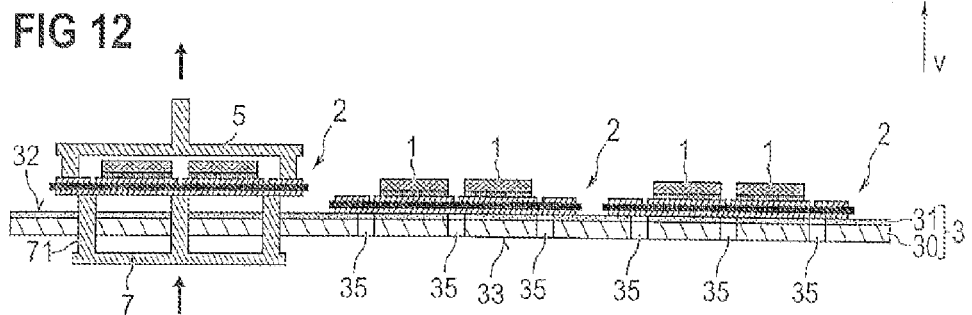

After all the semiconductor chips 1 have been placed onto the different circuit carriers 2 in the described manner, the circuit carriers 2 provided with the semiconductor chips 1 may be removed from the adhesion carrier 3, as shown in FIGS. 11 and 12. The removal is carried out by using a pick-and-place device 5. This may be the same pick-and-place device 5 as described above with reference to FIGS. 3 to 5, or a different pick-and-place device 5.

Optionally, the removal of the circuit carriers provided with the bonding medium 4 and the semiconductor chip or chips 1 may be assisted with the aid of a separating tool 7. The separating tool 7 has one or more projections 71, which can respectively be inserted starting from the lower side 33 into the through-openings 35 of the adhesion carrier 3, inserted into these through-openings 35 in the direction of the upper side 32, and pressed against the circuit carrier 2, so that the latter can be separated from the adhesive upper side 32 and removed with the aid of the pick-and-place device 5. Depending on the size of the circuit carrier 2 and its mechanical stability, the number, size and distribution of the projections 71, and therefore also of the through-openings 35, may be adapted so that an excessively non-uniform load on the circuit carrier 2 is avoided, and it can be removed without damage.

Figure 13:
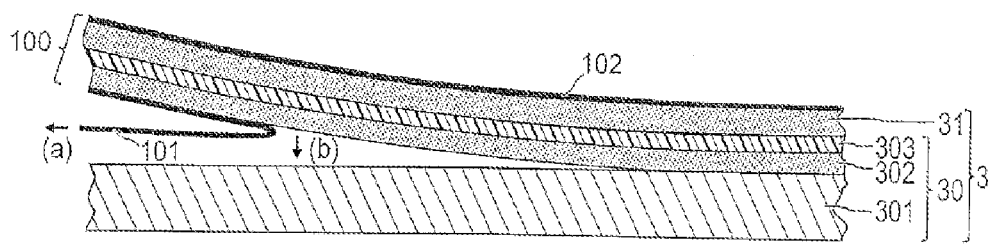
FIGS. 13 and 14 show an example of an adhesion carrier.

FIG. 13 now shows another example of an adhesion carrier 3, which has an adhesive surface 32. Such an adhesion carrier 3 may, for example, be produced by a double-sided bonding film 100 being adhesively bonded onto a mechanically stable carrier plate 301. The film 100 has a carrier layer 303 which is provided with an bonding layer 302 on one side, and with the future adhesion layer 31 on the opposite side. By means of the bonding layer 302, the film 100 is adhesively bonded onto the carrier plate 301. In order to prevent contamination of the bonding layer 302 before the adhesive bonding, it may be provided with a first protective film 101 on its side facing away from the carrier layer 303. Correspondingly, the bonding layer, the future adhesion layer 31, may be provided with a second protective film 102 on its side facing away from the carrier layer 303 before placement of the circuit carrier or carriers 2. The production of the adhesion carrier 3 is carried out in such a way that the first protective film 101 is removed from the bonding layer 302 (step (a)) and the film 100 is then adhesively bonded onto the carrier plate 301 (step (b)).

Figure 14:
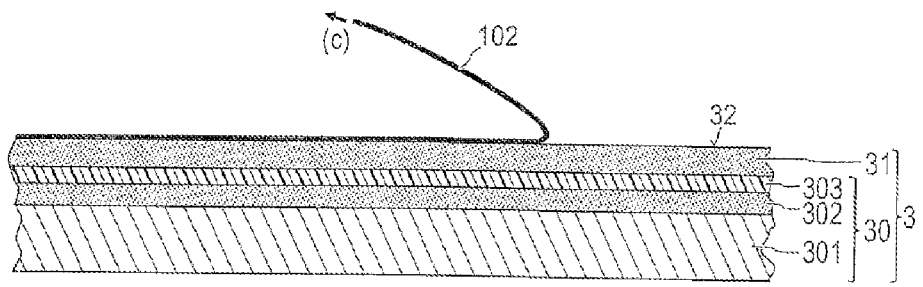

After full adhesive bonding of the film 100 onto the carrier plate 301 the second protective film 102 is then removed from the adhesion layer 31, as represented in FIG. 14, so that it is exposed and an adhesive surface 32 is available (step (c)), onto which, as explained above, one or more circuit carriers 2 can be placed. The removal of the second protective film 102 may be carried out not until immediately before placement of the circuit carrier or carriers 2, in order to minimize the risk of contamination of the adhesive surface 32.

Optionally, a silicone-free material may be selected for the adhesion layer 31. In this way, it is possible to avoid contamination taking place during the processing of the circuit carriers 2 placed onto the adhesive surface 32 with silicone, which may emerge from the adhesion layer 31. Deposition of silicone on a surface of a circuit carrier or of a component mounted on a circuit carrier 2, on which a material-fit connection to a further element is intended to be established (for example by soldering, sintering or adhesive bonding), would reduce the quality of the material-fit connection.

For example, aluminum (pure or anodized), glass-filled epoxide or magnesium alloy are suitable as a material for the carrier plate 301. In principle, however, any other desired materials and composite materials may be used, so long as they withstand the respective necessary process conditions during the processing of the circuit carriers 2 and have a sufficient mechanical stability for the processing, and so long as the bonding layer 302 can be adhesively bonded to the carrier plate 301.

For example, glass-epoxide or polyimide are suitable as a material for the carrier layer 303, but also any other desired materials, in particular free of silicone.

A suitable film 100 is, for example, the silicone-free "assist tape" with the designation "NS-250B" from Shin-Etsu Polymer Europe B.V. in 5928NS Venlo, Netherlands.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor module, the method comprising:
   providing an adhesion carrier having an adhesive upper side and a lower side opposite the adhesive upper side;
   providing a plurality of circuit carriers, each of which has a ceramic carrier, an upper conductor layer applied onto the ceramic carrier and a circuit carrier lower side;
   producing a quasi-panel by placing the circuit carriers onto the adhesive upper side, so that the circuit carrier lower side of the corresponding circuit carrier contacts and adheres to the adhesive upper side;
   processing the circuit carriers while preserving the quasi-panel; and
   removing the circuit carriers from the adhesive upper side.

2. The method of claim 1, wherein:
   the adhesion carrier has a number of through-openings, each of which extends continuously between the upper side and the lower side of the adhesion carrier; and
   the removal of each of the circuit carriers from the adhesive upper side is carried out by means of a separating tool which has one or more projections, each of which is inserted starting from the lower side into one of the through-openings located under the circuit carrier to be removed, and is pressed against the circuit carrier.

3. The method of claim 1, further comprising:
   providing a plurality of further circuit carriers, each of which has a ceramic carrier, an upper conductor layer applied onto the ceramic carrier and a circuit carrier lower side; and
   producing a quasi-panel by placing the further circuit carriers onto the adhesive upper side, so that the circuit carrier lower side of the corresponding further circuit carrier contacts and adheres to the adhesive upper side.

4. The method of claim 3, further comprising:
   processing the further circuit carriers while preserving the quasi-panel; and
   removing the further circuit carriers from the adhesive upper side.

5. The method of claim 3, further comprising:
   cleaning the adhesive upper side after the removal of the circuit carriers from the adhesive upper side and before placement of the further circuit carriers onto the adhesive upper side.

6. The method of claim 1, wherein for each of the circuit carriers, an adhesion strength between the adhesive upper side of the adhesion carrier and the circuit carrier lower side of the corresponding circuit carrier placed onto the adhesion carrier is less than or equal to 4.5 N/cm$^2$.

7. The method of claim 1, wherein for each of the circuit carriers, an adhesion strength between the adhesive upper side of the adhesion carrier and the circuit carrier lower side of the corresponding circuit carrier placed onto the adhesion carrier is greater than 0.13 N/cm$^2$ at the positions where the circuit carrier contacts the adhesive upper side.

8. The method of claim 1, wherein for each of the circuit carriers, a removal force required to remove the circuit carrier from the adhesive surface is greater than 2 times and/or less than 70 times the weight of that circuit carrier.

9. The method of claim 1, wherein the adhesion carrier comprises a base carrier onto which a polymer adhesion layer is applied, a side of the polymer adhesion layer facing away from the base carrier forming the adhesive upper side of the adhesion carrier.

10. The method of claim 1, wherein the processing of the circuit carriers comprises application of a bonding medium onto the upper conductor layer of each of the circuit carriers, the bonding medium being a metal paste, a paste containing metal, or an adhesive.

11. The method of claim 10, wherein the processing of the circuit carriers comprises placement of one or more semiconductor chips onto the bonding medium applied onto the upper conductor layer of the respective circuit carrier.

* * * * *